United States Patent
Lok

(10) Patent No.: US 11,855,651 B2
(45) Date of Patent: Dec. 26, 2023

(54) DISCRETE-TIME OFFSET CORRECTION CIRCUIT EMBEDDED IN A RESIDUE AMPLIFIER IN A PIPELINED ANALOG-TO-DIGITAL CONVERTER (ADC)

(71) Applicant: Caelus Technologies Limited, Hong Kong (HK)

(72) Inventor: Chi Fung Lok, Hong Kong (HK)

(73) Assignee: Caelus Technologies Limited, Hong Kong (HK)

( * ) Notice: Subject to any disclaimer, the term of this patent is extended or adjusted under 35 U.S.C. 154(b) by 146 days.

(21) Appl. No.: 17/717,061

(22) Filed: Apr. 9, 2022

(65) Prior Publication Data

US 2023/0327679 A1    Oct. 12, 2023

(51) Int. Cl.
*H03M 1/10* (2006.01)
*H03M 1/06* (2006.01)

(52) U.S. Cl.
CPC .................. *H03M 1/0607* (2013.01)

(58) Field of Classification Search
CPC .... H03M 1/0607; H03M 1/403; H03M 1/468; H03M 1/167; H03M 1/1009
USPC ........................................................ 341/120
See application file for complete search history.

(56) References Cited

U.S. PATENT DOCUMENTS

| | | |
|---|---|---|
| 7,764,118 B2 | 7/2010 | Kusuda et al. |
| 7,843,233 B2 | 11/2010 | Lee |
| 8,040,264 B2 * | 10/2011 | Hummerston ...... H03F 3/45475 348/241 |
| 9,219,492 B1 | 12/2015 | Lok et al. |
| 11,177,821 B1 | 11/2021 | Steensgaard-Madsen et al. |
| 11,545,991 B2 * | 1/2023 | Steensgaard-Madsen ................... H03M 1/44 |
| 2011/0115661 A1 * | 5/2011 | Steensgaard-Madsen ................... H03M 1/162 341/155 |
| 2014/0253237 A1 | 9/2014 | Lyden et al. |

OTHER PUBLICATIONS

European Search Report, 22198554.2-1205, May 23, 2023.
(Continued)

*Primary Examiner* — Jean B Jeanglaude
(74) *Attorney, Agent, or Firm* — gPatent LLC; Stuart T Auvinen

(57) ABSTRACT

A multi-stage pipelined Analog-to-Digital Converter (ADC) has an offset correction circuit embedded in the residue amplifier between stages. The offset corrector has a low-pass filter that filters the output of the residue amplifier, and the filtered offset is amplified and stored on an offset capacitor during an autozeroing phase of the residue amplifier. During an amplify phase of the residue amplifier, switches disconnect the amplifier from the offset capacitor and instead ground the input of the offset capacitor, and other switches connect the output terminal of the offset capacitor to the input of the residue amplifier. The offset stored on the offset capacitor is combined with the residue voltage from the first ADC stage's capacitor array and applied to an input of the residue amplifier to effectively subtract the detected offset. Two offset capacitors and sets of switches can be used to implement a differential offset corrector.

20 Claims, 13 Drawing Sheets

(56) References Cited

OTHER PUBLICATIONS

Hendrik Van Der Ploeg et al, "A 2.5-V 12-b 54-Msample/s 0.25-m CMOS ADC in 1-mm With Mixed-Signal Chopping and Calibration", IEEE JSSC, vol. 36, No. 12, Dec. 2001, pp. 1859-1867.

Yong Lim et al., "A 1 mW 71.5 dB SNDR 50 1-20 MS/s 13 bit Fully Differential Ring Amplifier Based SAR-Assisted Pipeline ADC", IEEE Journal of Solid-State Circuits, vol. 50, No. 12, Dec. 2015, pp. 2901-2911.

\* cited by examiner

PHASE P1: AUTOZEROING

PHASE P2: AMPLIFY

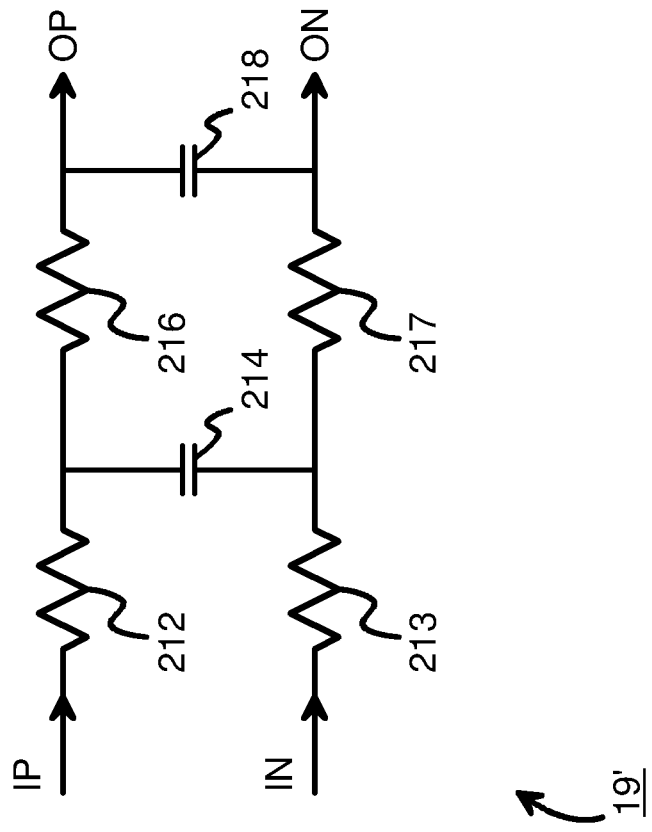
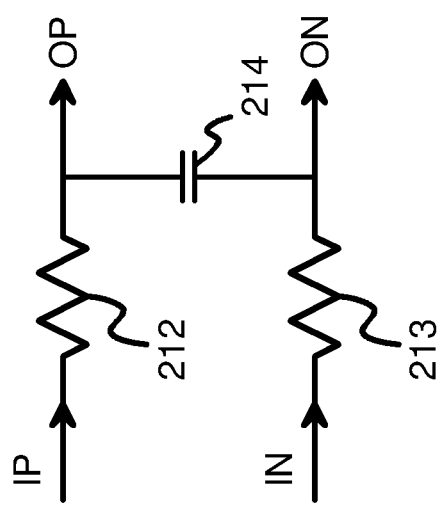
FIG. 12B
FIG. 12A

US 11,855,651 B2

DISCRETE-TIME OFFSET CORRECTION CIRCUIT EMBEDDED IN A RESIDUE AMPLIFIER IN A PIPELINED ANALOG-TO-DIGITAL CONVERTER (ADC)

FIELD OF THE INVENTION

This invention relates to offset cancellation, and more particularly an offset cancellation network in a residue amplifier in Analog-to-Digital Converters (ADCs).

BACKGROUND OF THE INVENTION

Analog-to-Digital Converters (ADC) are widely used in many applications. Some applications require both high precision and high sampling speed. High precision can be achieved using multi-bit ADC's, such as 8-bits to 12-bits of precision.

FIG. 1 shows a capacitor array in an ADC. Converter 101 has a weighted array of capacitors 20, 26, 28 that share charge to the inputs to comparator 12 that generates a digital bit VCOMP that is 1 when the + input to comparator has a higher voltage than the − input.

A controller or sequencer (not shown) controls switches 16, 18 that allow various voltages to be switched to the outer or bottom plates of capacitors 20, 26, 28. Each switch can be individually controlled. A Successive-Approximation (SA) routine may be used to switch successively smaller capacitors on or off to test different digital values to see which digital value is closest to the analog input voltage.

For example, converter 101 may be initialized by setting all switches 16, 18 to connect a common-mode voltage VCM to the outer plates of all capacitors 20, 26, 28. The + and − input lines to comparator 12 may also be driven to VCM by equalizing switches (not shown). VCM can be generated as a midpoint between the reference voltages, such as (Vrefp+Vrefn)/2, using a 1:1 resistor divider.

Then in a sampling phase the true analog voltage Vinp may be applied by switches 16, 18 to the outer plates of all capacitors 20, 26 that have inner (top) plates connected to the + input of comparator 12, while the complement analog voltage Vinn is applied by switches 16, 18 to the outer plates of all capacitors 20, 28 that have inner plates connected to the − input of comparator 12. VCM is applied to both inputs of comparator 12. The differential analog input voltage is thus sampled into the plates of capacitors 20, 26, 28.

Next, during an evaluation phase switches 16, 18 drive VCM to all output plates, but a Successive-Approximation routine tests successively smaller capacitors that are driven with the reference voltage rather than with VCM.

For example, when the Most-Significant Bit (MSB) capacitors 26, 28 are being tested, upper switch 18 connects reference Vrefn to the outer plate of MSB capacitor 26, while lower switch 18 connects reference Vrefp to the outer plate of MSB capacitor 28. This switching causes charge sharing and charges to be shifted between MSB capacitors 26, 28 and the + and − input lines to comparator 12, which may flip the digital output VCOMP. The SA routine can watch VCOMP for the flip and set to clear bits in a Successive-Approximation-Register (SAR) as a result. By testing successively smaller capacitors 20, the SA routine can fill the SAR with a good approximation of the analog input voltage.

FIG. 2 shows a prior art multi-stage ADC with a residue amplifier. Rather than have a single converter 101 with many bits of resolution, multiple converters 106, 116 may be used in multiple stages. For example, rather than have a 12-bit single converter 101, first converter 106 may generate 5 bits (Most-Significant Bits, MSB), while second converter 116 generates another 8 bits (Least-Significant Bits, LSB).

Input voltage VIN is applied to first converter 106, which can have an array of capacitors and switches such as shown for converter 101 (FIG. 1). First converter 106 uses a SA routine to toggle switches until a final code is found and stored in a first SAR, SAR1 108.

Then the residual voltage, on the + input to comparator 12 in FIG. 1, is applied to the inverting (−) input of residue amplifier 22 and amplified to drive the analog voltage input to second converter 116. Like converter 101, second converter 116 has an array of capacitors and switches and uses a SA routine to toggle switches until a final code is found and stored in a second SAR, SAR2 118.

Feedback capacitor 104 feeds back the output of residue amplifier 22 to its inverting (−) input, while the non-inverting (+) input of residue amplifier 22 is connected to ground. The closed-loop gain is C1/C2>1, where C1 is the capacitance of first converter 106 and C2 is the capacitance of feedback capacitor 104. C1 does not vary with the code in SAR1 108.

In actual circuits there is a small non-zero offset error in residue amplifier 22 that can be modeled by offset voltage 102 connected between the non-inverting (+) input of residue amplifier 22 and ground. This VOS error can be caused by mismatches in residue amplifier 22. Since VOS occurs before the input to residue amplifier 22, this VOS error is amplified by the closed-loop gain of residue amplifier 22 and applied to the input to second converter 116. When this error is large, second converter 116 may not be able to correct this error.

For example, is the open-loop gain of residue amplifier 22 is >>0, such as 60 dB, the output of residue amplifier 22, Vo, can be approximated as:

$$V_O \approx \frac{C_1}{C_2} V_i + \left(1 + \frac{C_1}{C_2}\right) V_{OSi,RA}$$

where Vi is the quantization noise of first converter 106, and, $V_{OSi,RA}$ is input-equivalent offset voltage of residue amplifier 22, or VOS, offset voltage 102.

Notice that if $C_1/C_2$ is 4 and $V_{OSi,RA}$ is [−10 mV,+10 mV], then the output equivalent offset voltage will be [−50 mV,+50 mV]. This value is too far out of the redundancy range in this example, so second converter 116 is required to cancel such an offset voltage.

Correction by second converter 116 to cancel the offset amplified by residue amplifier 22 is normally performed in the foreground and can't track environmental changes. Also, in real applications, the correction range may need to be [−80 mV,+80 mV] in second converter 116, which would require a very precise DAC, such as 250 uV LSB, for a 10b DAC, which is hard to achieve. Drift on the output of residue amplifier 22 can be more than [−10 mV, +10 mV], which can be out of the redundancy range, causing long-term reliability issues.

Over time, offset VOS can change, such as when the circuit heat up, or as the circuit ages. Offset VOS can change with Process, Voltage, and Temperature (PVT). It is desirable to track such changes in offset voltage VOS and correct these offset errors.

What is desired is an offset detection and correction circuit for a residue amplifier in a multi-stage ADC. A discrete-time offset-compensation circuit embedded in a residue amplifier is desired for use in a high speed and high resolution pipeline ADC. A residue amplifier offset corrector that tracks changes to offset over time and conditions is desirable. A real-time offset corrector is desired that operates during ADC conversions.

BRIEF DESCRIPTION OF THE DRAWINGS

FIGS. 12A-12B show embodiments of the differential low-pass filter.

DETAILED DESCRIPTION

The present invention relates to an improvement in ADC offset correction. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 3:
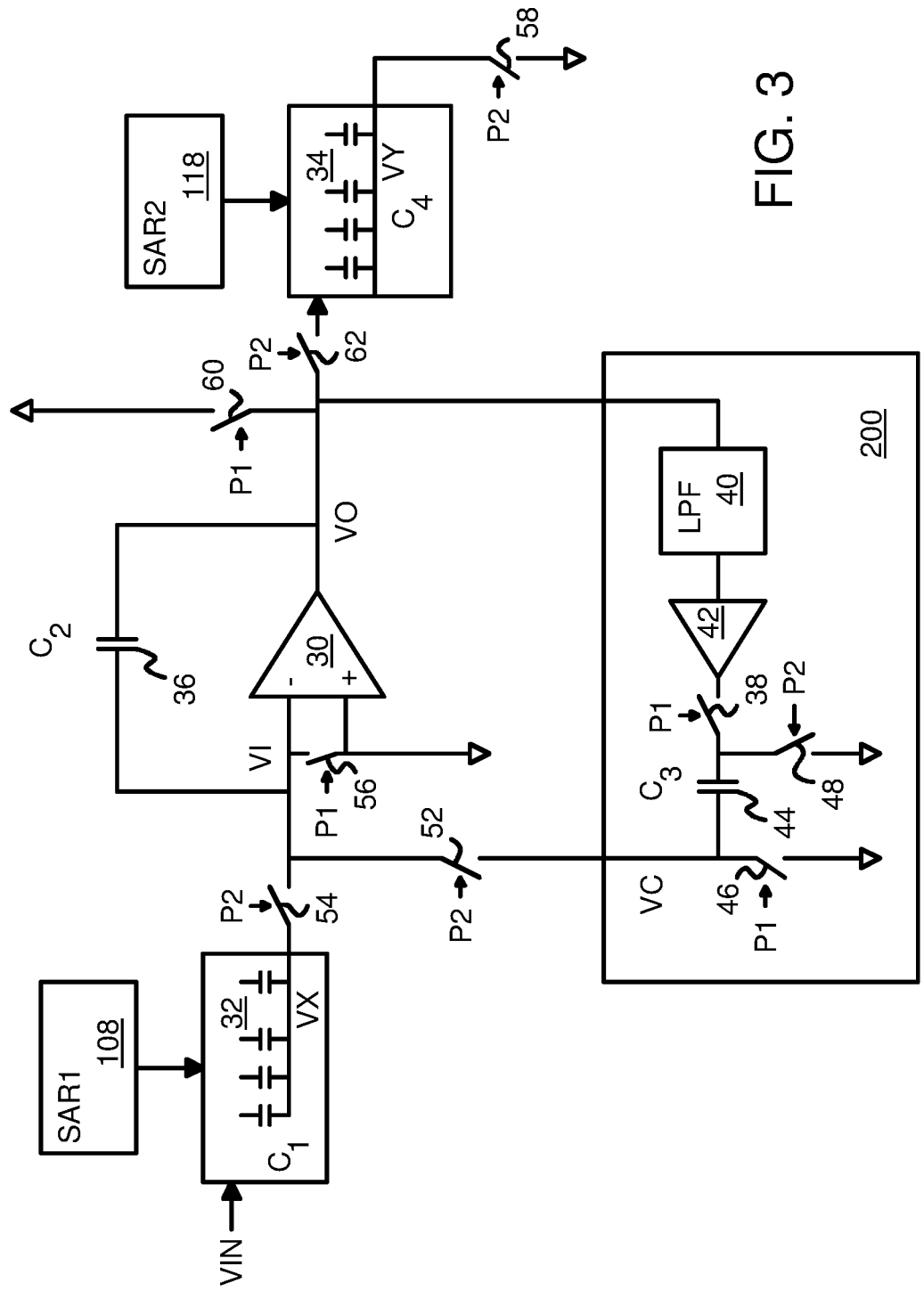
FIG. 3 shows a single-ended multi-stage pipelined ADC with an offset correction circuit embedded in the residue amplifier between stages.

FIG. 3 shows a single-ended multi-stage pipelined ADC with an offset correction circuit embedded in the residue amplifier between stages. A first converter receives input analog voltage VIN and has first capacitor array 32 with switches controlled by SAR1 108. A comparator (not shown) compares voltage VX connected to the switched capacitors in first capacitor array 32 to a reference to allow a SA routine to decide when to set or clear bits in SAR1 108. The bits in SAR1 108 are MSB's of the digital output, such as 5 MSBs.

Switch 54 closes in phase P2 to connect VX to VI and the inverting (−) input of residue amplifier 30. Switch 56 opens and the non-inverting (+) input of residue amplifier 30 is grounded. Feedback capacitor 36 connects the output of residue amplifier 30, VO, with its input, VI.

Switch 62 closes during phase P2 to connect output VO of residue amplifier 30 to the analog input of the second converter. which has second capacitor array 34 with switches controlled by SAR2 118. A comparator (not shown) compares voltage VY connected to the switched capacitors in second capacitor array 34 to a reference to allow a SA routine to decide when to set or clear bits in SAR2 118. The bits in SAR2 118 are LSB's of the digital output, such as 8 LSBs.

Switch 58 drives VY to ground during phase P2 while switch 60 drives VO to ground during phase P1.

Offset detection and correction is provided by offset corrector 200. Output VO of residue amplifier 30 is filtered by low-pass filter 40 and then amplified by amplifier 42 to generate a filtered detected offset that is driven onto offset capacitor 44 during phase P1 when switch 38 closes, and switch 46 closes to ground the back terminal, node VC, of offset capacitor 44. Amplifier 42 can have a closed-loop gain of 4× to 10× in some embodiments.

During phase P2, the offset stored on offset capacitor 44 at node VC is driven through switch 52 to VI and the inverting input of residue amplifier 30. The filtered detected offset stored on offset capacitor 44 is thus applied to the (−) input of residue amplifier 30 and effectively subtracted from the RA input voltage. Node VX from first capacitor array 32 is connected through switch 54 while node VC is connected through switch 52 during phase P2, so VC is combined with VX.

Switch 48 grounds the first terminal of offset capacitor 44 during phase P2 to drive the filtered stored offset from offset capacitor 44 through switch 52 to be combined with VX.

Figure 4:
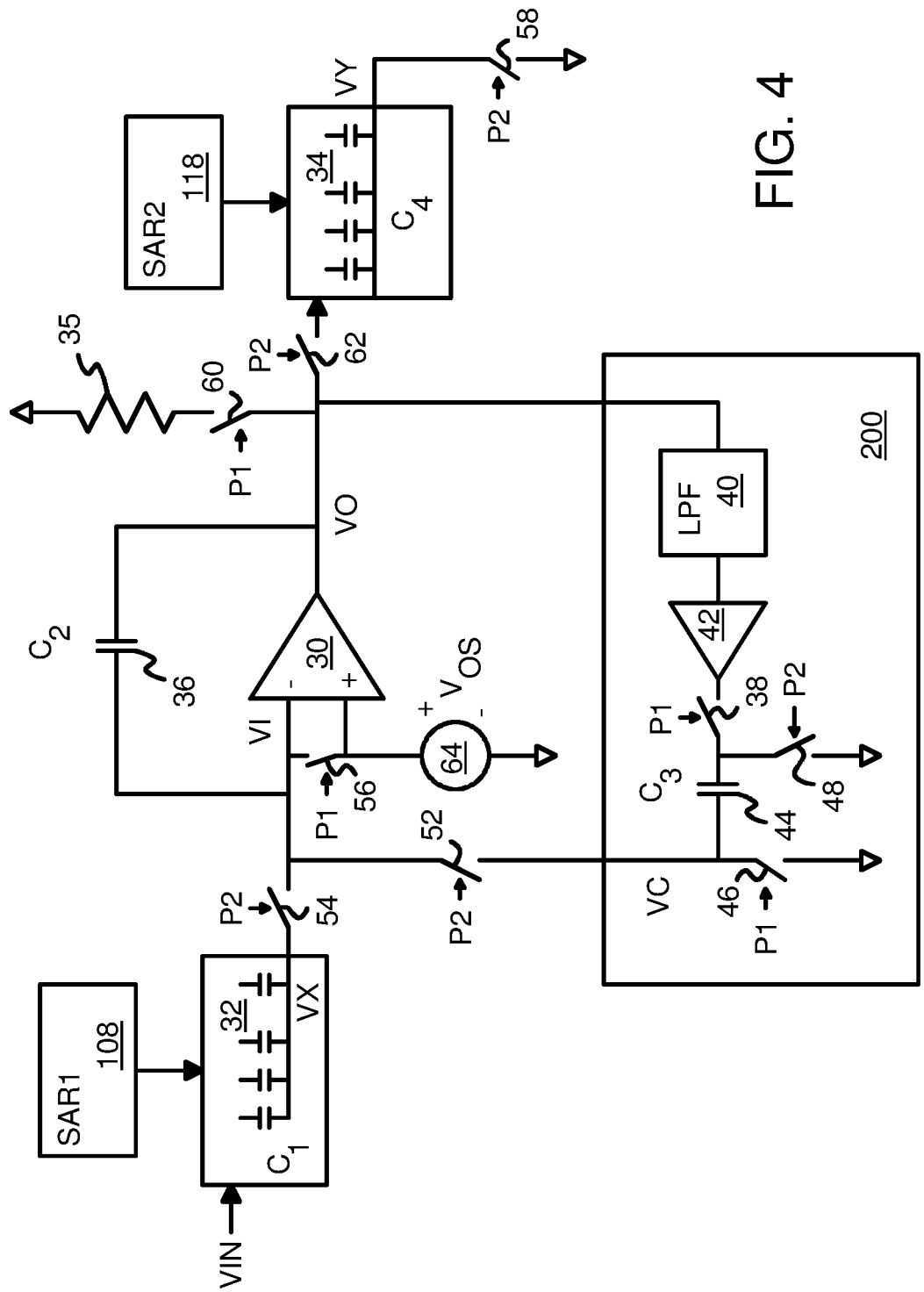
FIG. 4 shows modeling of the single-ended multi-stage pipelined ADC with an offset correction circuit embedded in the residue amplifier between stages.

FIG. 4 shows modeling of the single-ended multi-stage pipelined ADC with an offset correction circuit embedded in the residue amplifier between stages. The actual offset of residue amplifier 30 is modeled as offset voltage VOS generated by offset voltage generator 64. Offset voltage generator 64 is not a physical component but is a modeled component for circuit simulation to account for physical offsets and mismatches from various physical sources, such as from mismatches in residue amplifier 30.

Resistor 35 connects VO to ground when switch 60 is closed. Resistor 35 is not a physical component but represents the finite ON resistance of switch 60.

Figure 5:
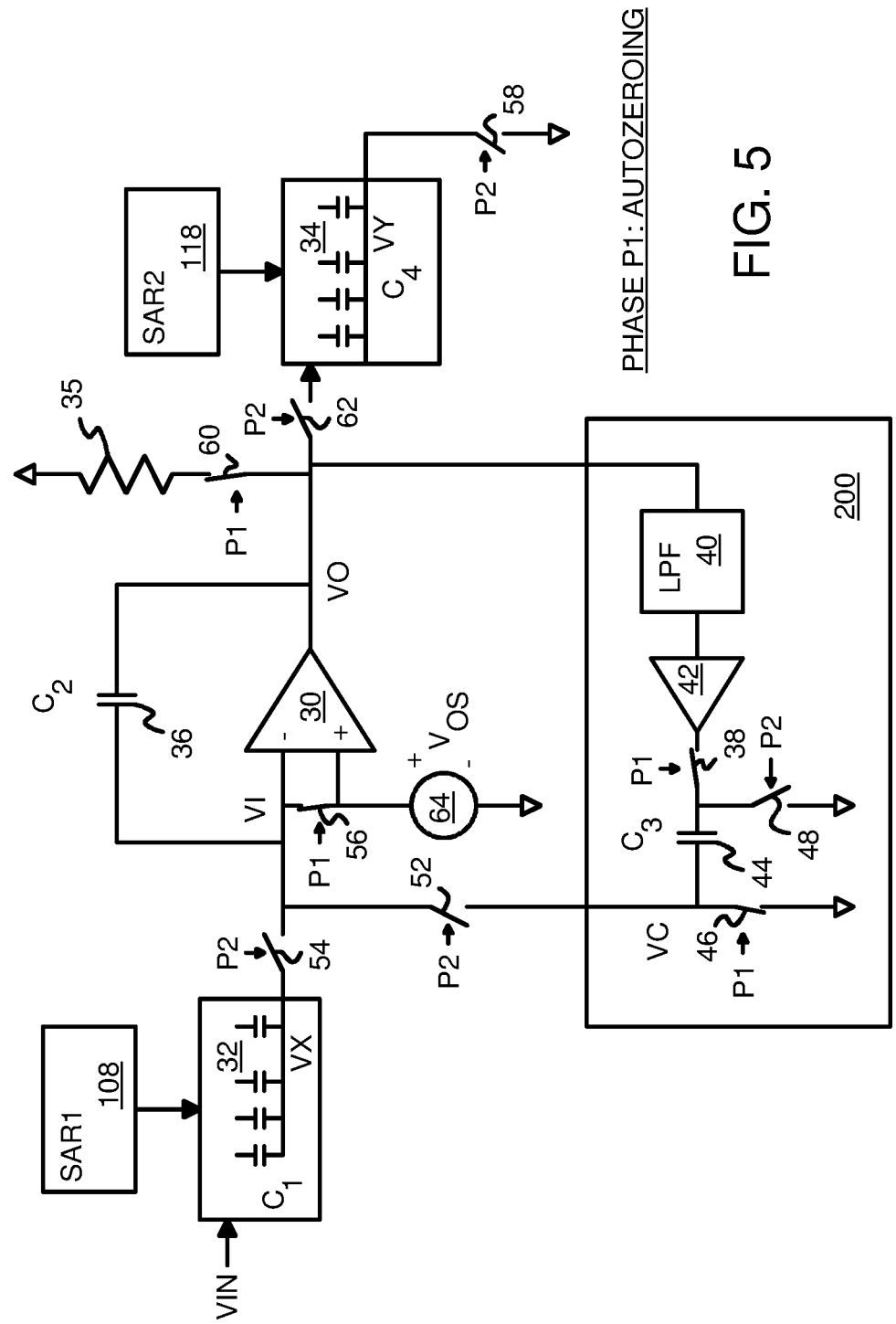
FIG. 5 highlights the autozeroing phase model of the single-ended multi-stage pipelined ADC with the offset correction circuit embedded in the residue amplifier between stages.

FIG. 5 highlights the autozeroing phase model of the single-ended multi-stage pipelined ADC with the offset correction circuit embedded in the residue amplifier between stages. Phase P1 is RA autozeroing, where residue amplifier 30 is equalized and reset. Phase P1 is also the ADC conversion phase, since analog-to-digital conversions are performed by first capacitor array 32, SAR1 108, second capacitor array 34, and SAR2 118.

In phase P1, all P2 switches 48, 52, 54, 58, 62 are open. All P1 switches 38, 46, 56, 60 are closed. Switch 56 closes to connect the inverting (−) and non-inverting (+) inputs of residue amplifier 30 together to equalize them.

Switch 38 closes to allow amplifier 42 to drive the filtered detected offset onto the first terminal of offset capacitor 44, while switch 46 closes to ground the second terminal of offset capacitor 44, node VC. Thus the offset is detected and stored onto offset capacitor 44 during autozeroing phase P1. Low-pass filter 40 averages the output voltage VO of residue amplifier 30 over many cycles of P1, P2, such as thousands of cycles.

Switch 60 closes to drive the output VO of residue amplifier 30 to ground, causing residue amplifier 30 to act as a Gm transconductance due to the small resistance of resistor 35. The output voltage VO of residue amplifier 30 during autozeroing phase PQ can be given as:

$$V_O = \frac{1}{2} Gm R_{ON} V_{OSi,RA}$$

wherein Gm is the gain of residue amplifier 30, Ron is the resistance of resistor 35, and $V_{OSi,RA}$ is the input-equivalent offset voltage of residue amplifier 30, or VOS, from offset voltage generator 64.

Low-pass filter 40 has a very low frequency to detect the DC voltage of VO. At a high speed and low offset, residue amplifier 30 has an open-loop DC gain of Aos. Therefore the offset voltage V3 sampled on offset capacitor 44 with capacitance C3 is given by:

$$V_3 = \frac{1}{2} Gm R_{ON} A_{OS} V_{OSi,RA}$$

In advanced circuit design, a relatively constant $GmR_{ON}A_{OS}$ with variations of +/−15% from nominal value may be obtained. For instance, constant Gm biasing (i.e. $I_{BIAS} \propto 1/R$) can be used to obtain constant Gm over process, supply and temperature such that both Gm and $A_{OS}=Gm_{OS}*R$ can be flat over PVT. Thin film resistors can be used in a CMOS process to have an accurate resistance R. Switch ON resistance $R_{ON}$ can be designed with bootstrapping switches such that the variation of on the ON resistance can be made small over PVT. With such an approach, $GmR_{ON}A_{OS}$ can be designed with less variation over PVT to keep the offset correction drift low over variations.

Figure 6:
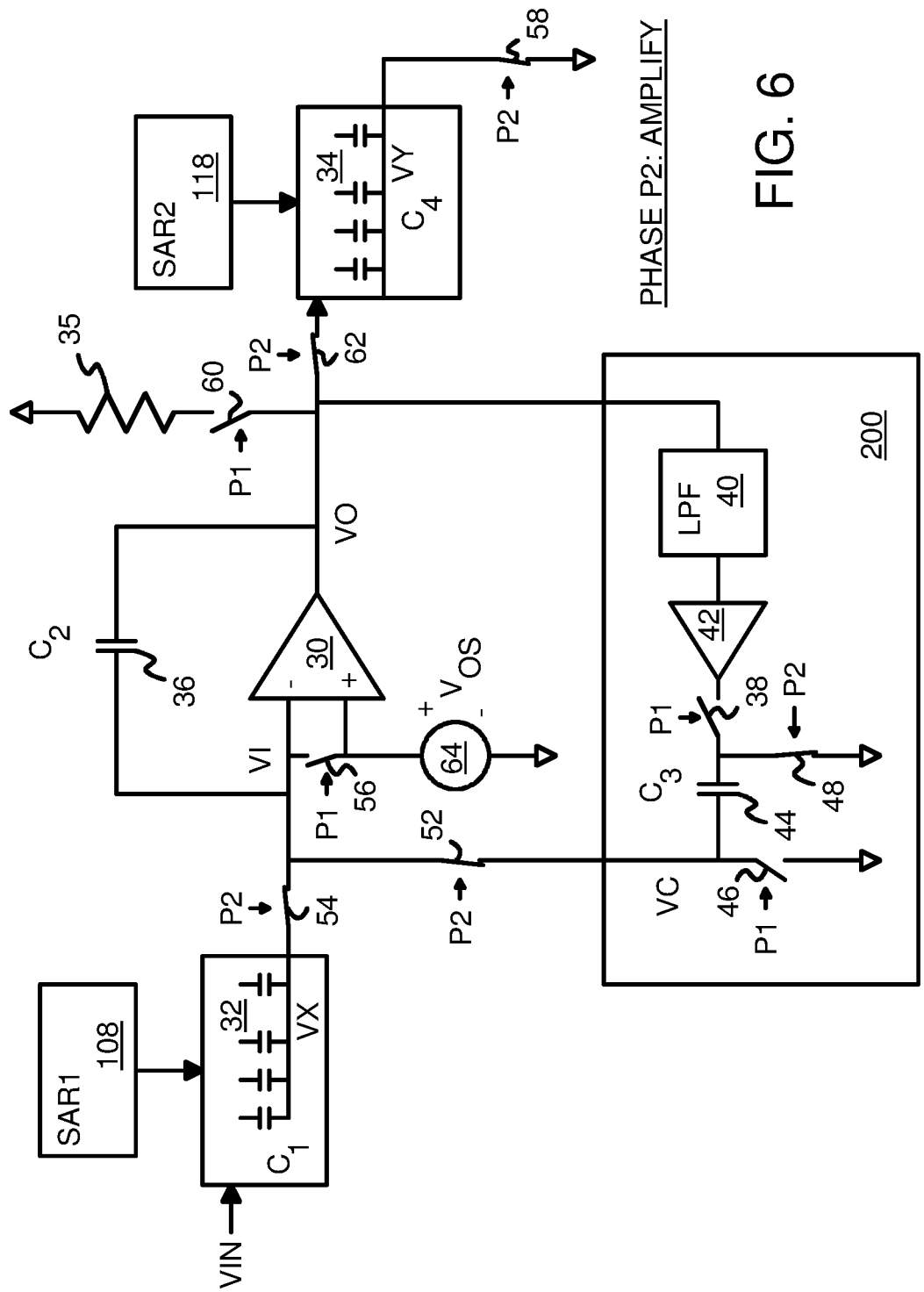
FIG. 6 highlights the amplify phase model of the single-ended multi-stage pipelined ADC with the offset correction circuit embedded in the residue amplifier between stages.

FIG. 6 highlights the amplify phase model of the single-ended multi-stage pipelined ADC with the offset correction circuit embedded in the residue amplifier between stages. Phase P2 is RA amplifying, where residue amplifier 30 is amplifying its inputs. Phase P2 is also the ADC equalize phase, since first capacitor array 32 and second capacitor array 34 are equalized and prepared for analog-to-digital conversions in the next P1 phase.

In phase P2, all P2 switches 48, 52, 54, 58, 62 are closed. All P1 switches 38, 46, 56, 60 are open. The quantization error or residual voltage on VX in first capacitor array 32, after SAR1 108 has found the closest match, is passed through switch 54 to VI, the inverting (−) input of residue amplifier 30. The offset stored on offset capacitor 44 is driven from node VC through switch 52 to be combined with VX at node VI, and effectively subtracted by residue amplifier 30. Switch 48 closes to drive the first terminal of offset capacitor 44 to ground to pull charge through offset capacitor 44 from VC and VI. Switches 38, 46 are open to permit this charge transfer or charge sharing on VI. Thus the offset voltage is applied to residue amplifier 30 for offset correction from offset corrector 200.

The output of residue amplifier 30, VO is connected to the analog input of second capacitor array 34 through switch 62, while combining node VY in second capacitor array 34 is grounded through switch 58.

During phase P2, with switch 60 open, residue amplifier 30 acts as an open-loop amplifier with a gain of Aos. The output voltage Vo of residue amplifier 30 is given by:

$$V_O = \frac{C_1}{C_2} V_{Q,SAR1} + \left(1 + \frac{C_1}{C_2} + \frac{C_3}{C_2}\right) V_{OSi,RA} - \frac{C_3}{C_2}\left(\frac{1}{2} Gm R_{ON} A_{OS}\right) V_{OSi,RA}$$

wherein C1 is the capacitance of first capacitor array 32 as configured by SAR1 108, C2 is the capacitance of feedback capacitor 36, C3 is the capacitance of offset capacitor 44, and C4 is the capacitance of second capacitor array 34 as configured by SAR2 118. $V_{Q,SAR1}$ is the quantization noise of SAR1 108.

To perfectly compensate for the offset voltage, the loop gain is given by:

$$\frac{1}{2} Gm R_{ON} A_{OS} = \left(\frac{C_1 + C_2 + C_3}{C_3}\right)$$

Therefore, amplifier 42 in offset corrector 200 is given by:

$$A_{OS} = \left(\frac{C_1 + C_2 + C_3}{C_3}\right)\frac{2}{Gm R_{ON}}$$

When amplifier 42 is implemented as a proper differential amplifier, it can have a gain of $k*2/GmR_{ON}$, where k is capacitor ratio given by $1+(C_1+C_2)/C_3$. Note that the ½ multiplier accounts for a half circuit in a fully differential circuit.

Figure 7B:
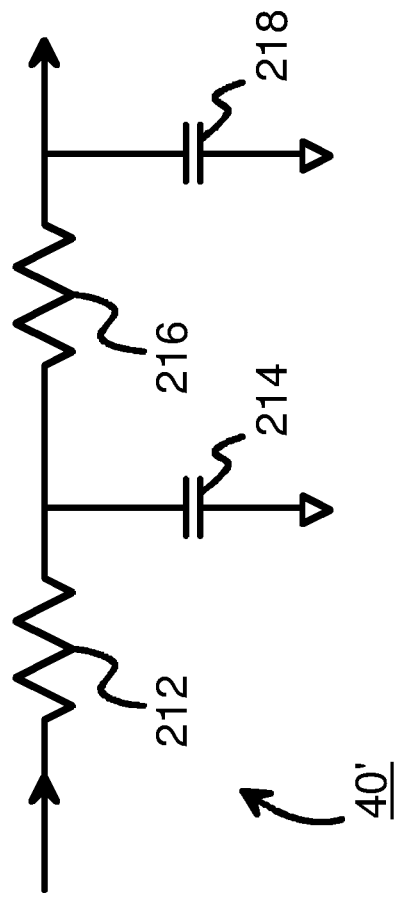
FIGS. 7A-7B show embodiments of the low-pass filter.
Figure 7A:
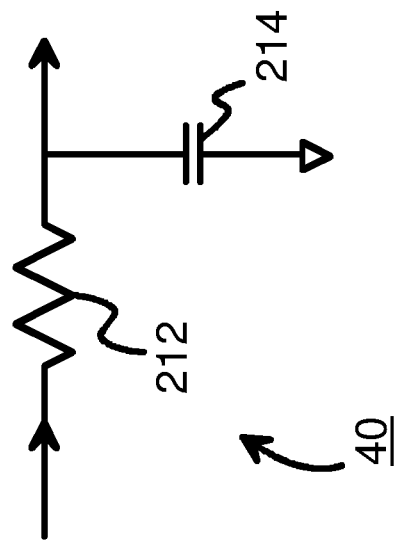

FIGS. 7A-7B show embodiments of the low-pass filter. In FIG. 7A, a first-order low-pass filter 40 is shown. Resistor 212 is connected between the input and the output of low-pass filter 40, while capacitor 214 is connected between the output of low-pass filter 40 and ground. A first-order filter network is simple but less effective than a second-order filter network.

In FIG. 7B, a second-order low-pass filter 40' is shown. Resistor 212 is connected between the input of low-pass filter 40 and an internal node, while resistor 216 is connected between the internal node and the output of low-pass filter 40'. Capacitor 214 is connected between the internal node and ground. Capacitor 218 is connected between the output of low-pass filter 40' and ground.

Although more complex, second-order low-pass filter 40' can be more effective than first-order low-pass filter 40. Second-order low-pass filter 40' can replace first-order low-pass filter 40 in the various embodiments of FIGS. 3-6, 9.

Low-pass filter 40 is used to sense the DC offset and reject the AC signal of output VO, so the bandwidth of low-pass filter 40 is designed to have a very low frequency (e.g. 1 MHz) for a high speed ADC. Low-pass filter 40 is also used to bandlimited noise power feedback to the analog input. Second order low-pass filter 40' is preferred to have roll off of −40 dB/decade.

Figure 8:
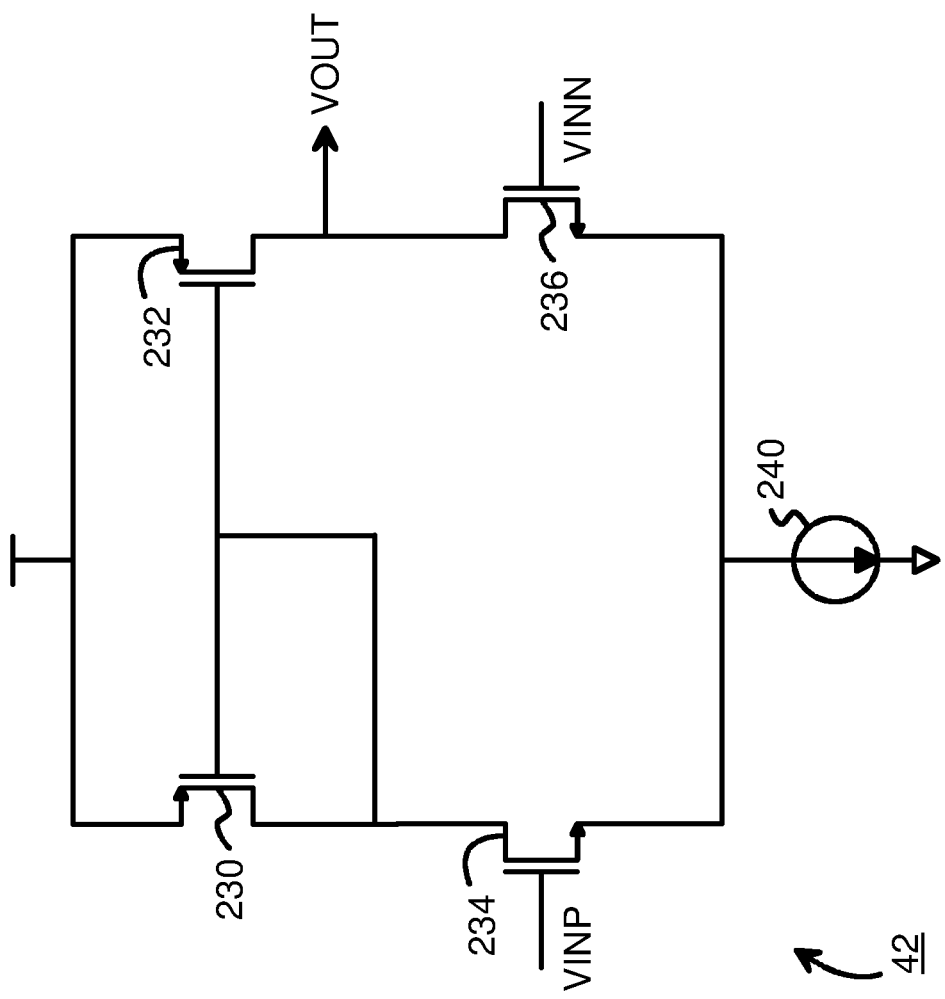
FIG. 8 shows in more detail the amplifier in the offset corrector.

FIG. 8 shows in more detail the amplifier in the offset corrector. Amplifier 42 has tail current source 240 that sinks current from the sources of n-channel transistors 234, 236. Current mirror p-channel transistors 230, 232 have their gates connected together and to the drain of transistor 230 as mirrored current sources. The drains of transistors 230, 234 connect together and to the gates of transistors 230, 232, while the drains of transistors 232, 236 connect together and drive the output VOUT.

The input VINP to amplifier 42 is applied to the gate of transistor 234 while a fixed bias voltage VB is applied to the gate of transistor 236. P-channel transistors 230, 232 can be long channel devices while n-channel transistors 234, 236 can be short channel, fast devices with good Gm.

Figure 9:
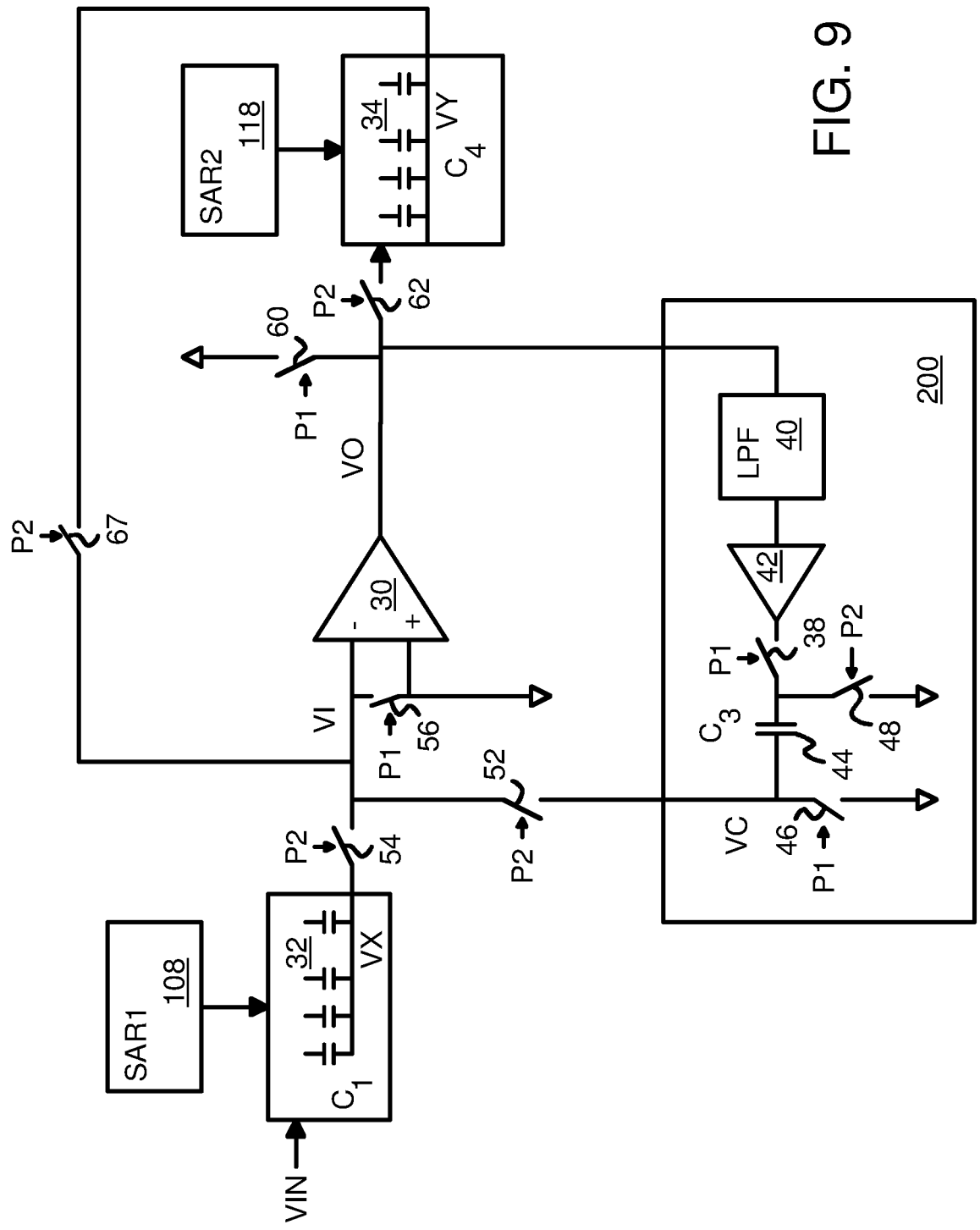
FIG. 9 shows a loading-free embodiment of the single-ended multi-stage pipelined ADC with the offset correction circuit embedded in the residue amplifier between stages.

FIG. 9 shows a loading-free embodiment of the single-ended multi-stage pipelined ADC with the offset correction circuit embedded in the residue amplifier between stages. In this variation, feedback switch 67 closes during phase P2 to connect the combining node VY in second capacitor array 34 with input VI to residue amplifier 30. Thus during the RA amplifying phase, VY is fed back rather than grounded as in FIG. 6. This is considered to be a loading-free configuration, since VY is not grounded or otherwise loaded.

A loading free architecture can use less current in residue amplifier 30 to have a higher settling speed during the amplification phase to transfer quantization noise of SAR1 to SAR2 via residue amplifier 30. This can make the circuit implementation of residue amplifier 30 to be more power efficient.

Figure 10:
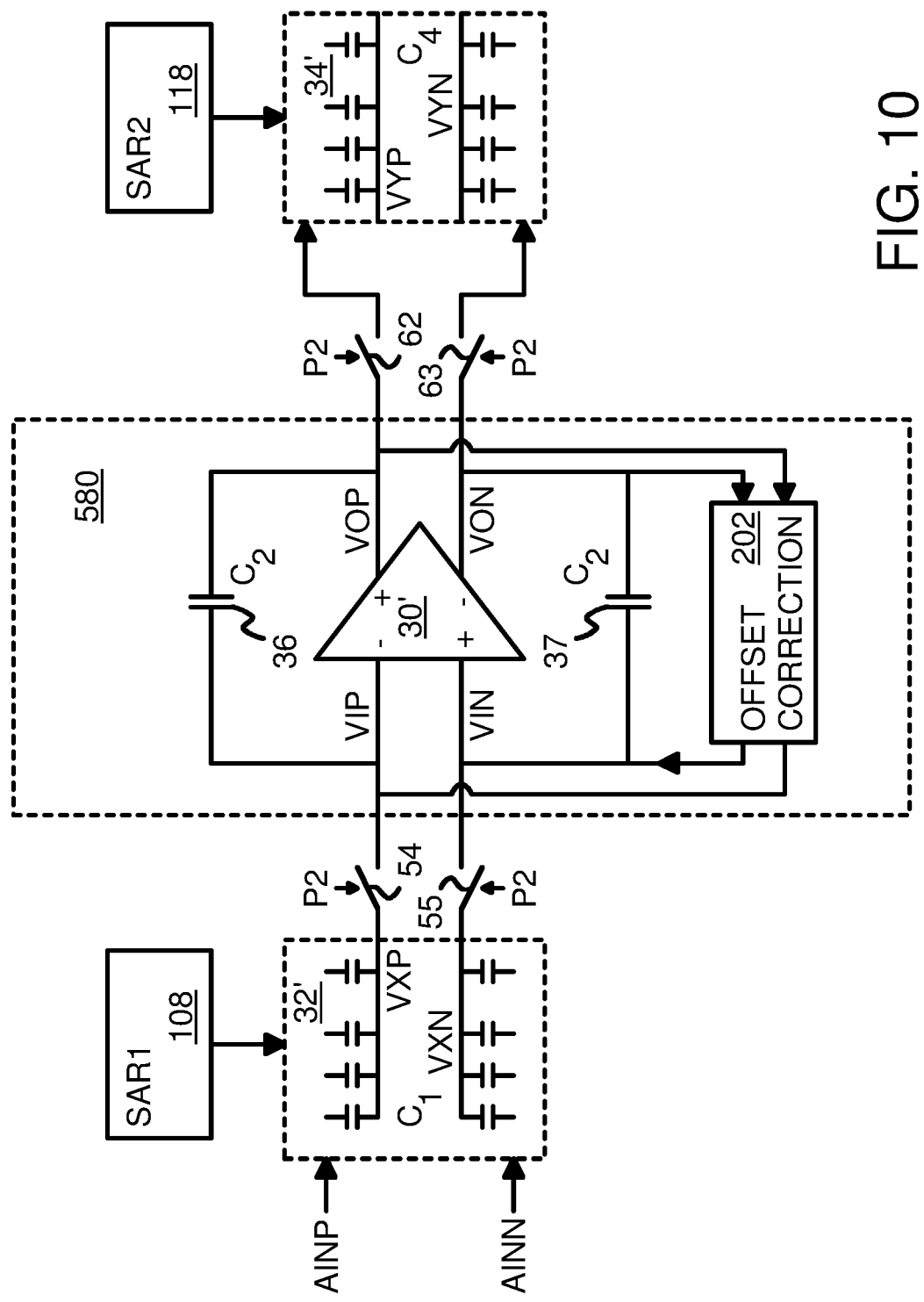
FIG. 10 shows a fully differential multi-stage pipelined ADC with the offset correction circuit embedded in the residue amplifier between stages.

FIG. 10 shows a fully differential multi-stage pipelined ADC with the offset correction circuit embedded in the residue amplifier between stages. A differential analog input AINP, AINN is applied to first capacitor array 32' that has capacitors switched by SAR1 108. AINP is switched to capacitors connected to VXP while AINN is switched to capacitors connected to VXN. During phase P1, a SA routine tests different bits of SAR1 108 that switch different capacitors in first capacitor array 32' until a best match digital value is found for the MSB's.

Switch 54 closes during phase P2 to connect VXP to VIP and the inverting (−) input of differential residue amplifier 30', and also switch 55 closes during phase P2 to connect VXN to VIN and the non-inverting (+) input of differential residue amplifier 30'. Feedback capacitor 36 connects the − input VIP and the + output VOP of residue amplifier 30', while feedback capacitor 37 connects the + input VIN and the − output VON of residue amplifier 30'.

Also during amplifying phase P2, switches 62, 63 close to connect VOP to AINP2, and to connect VON to AINN2. AINP2, AINN2 are the differential analog inputs to second capacitor array 34'. AINP2 is switched to capacitors connected to VYP while AINN2 is switched to capacitors connected to VYN. During phase P1, a SA routine tests different bits of SAR2 118 that switch different capacitors in second capacitor array 34' until a best match digital value is found for the LSB's.

Differential offset corrector 202 receives the VOP, VON outputs of residue amplifier 30', filters them, and stores the offset. The stored offset is then applied to inputs VIP, VIN to residue amplifier 30' to subtract the offset. Offset-correcting residue amplifier 580 has offset corrector 202 embedded with residue amplifier 30'.

Figure 11:
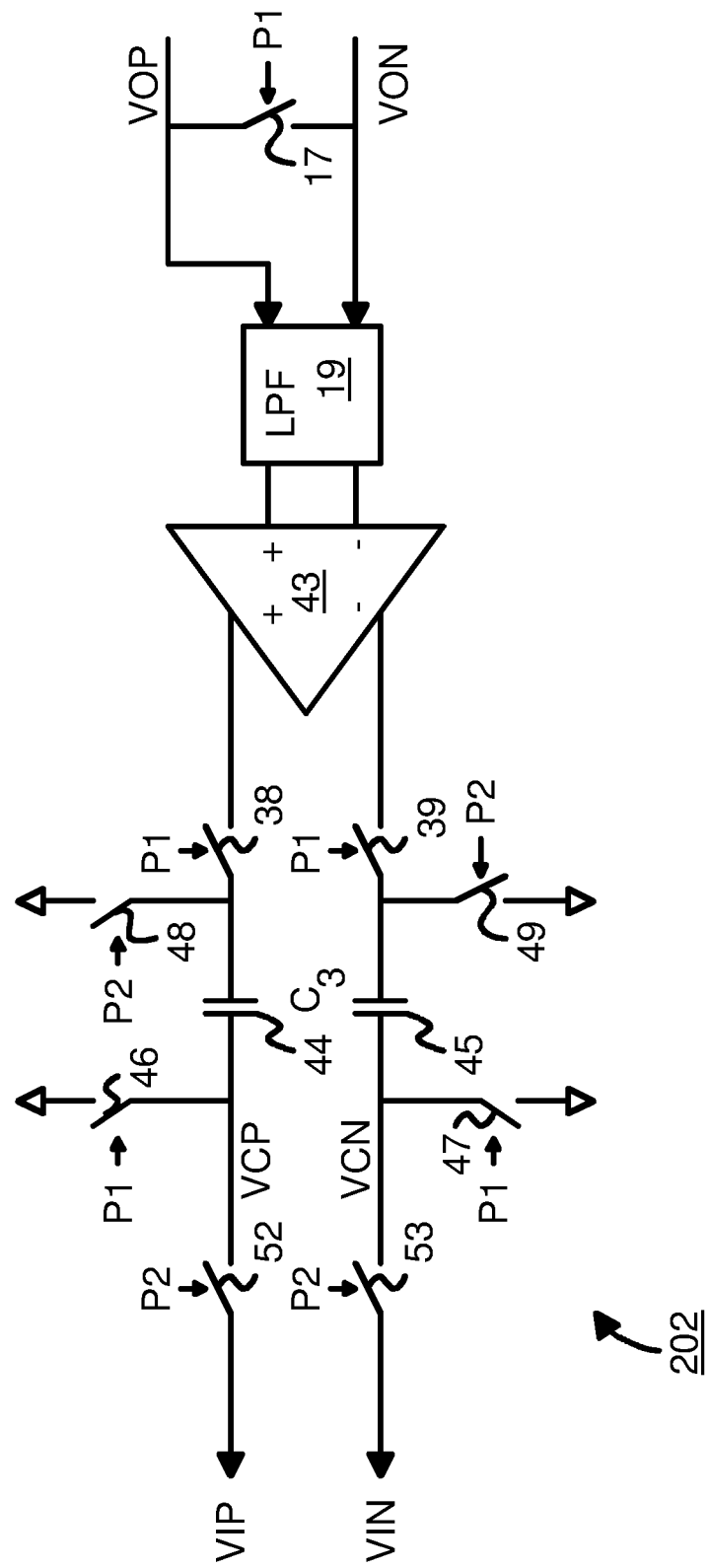
FIG. 11 shows the fully-differential offset corrector in more detail.

FIG. 11 shows the fully-differential offset corrector in more detail. Differential output VOP, VON of differential residue amplifier 30' is filtered by low-pass filter 19 in differential offset corrector 202 and then amplified by differential amplifier 43 to generate a filtered detected offset on its + and − outputs.

During phase P1, switches 38, 46 close to connect the + output of differential amplifier 43 to the first terminal of offset capacitor 44, while the second terminal, node VCP, is grounded. Also during phase P1, switches 39, 47 close to connect the − output of differential amplifier 43 to the first terminal of offset capacitor 45, while the second terminal, node VCN, is grounded. The offset filtered by low-pass filter 19 is driven onto offset capacitors 44, 45 during phase P1.

During phase P2, the offset stored on offset capacitor 44 at node VCP is driven through switch 52 to VIP and the inverting input of residue amplifier 30'. Also the offset stored on offset capacitor 45 at node VCN is driven through switch 53 to VIN and the non-inverting input of residue amplifier 30'. Switch 48 grounds the first terminal of offset capacitor 44 during phase P2 to drive the filtered stored offset from offset capacitor 44 through switch 52 to be combined with VXP at node VIP. Similarly, switch 49 grounds the first terminal of offset capacitor 45 during phase P2 to drive the filtered stored offset from offset capacitor 45 through switch 53 to be combined with VXN at node VIN.

The offset generated by residue amplifier 30' is only valid during the amplifying P2 phase. During the autozeroing P1 phase, residue amplifier 30 is being reset and low-pass filter 19 should not read the outputs of residue amplifier 30'. Switch 17 closes during phase P1 to equalize VOP, VON so that no erroneous offset is accumulated into low-pass filter 19. A similar equalizing switch (not shown) can be placed between VIP, VIN to equalize the during phase P1, or switches to VCM can be added to VIP, VIN.

FIGS. 12A-12B show embodiments of the differential low-pass filter. In FIG. 12A, a first-order differential low-pass filter 19 is shown. Resistor 212 is connected between the IP input and the OP output of differential low-pass filter 19, while capacitor 214 is connected between the OP and ON outputs of differential low-pass filter 19. Resistor 213 is connected between the IN input and the ON output of differential low-pass filter 19. A first-order filter network is simple but less effective than a second-order filter network.

In FIG. 12B, a second-order differential low-pass filter 19' is shown. Resistor 212 is connected between the IP input of differential low-pass filter 19 and an internal P node, while resistor 216 is connected between the internal P node and the OP output of differential low-pass filter 19'.

Resistor 213 is connected between the IN input of differential low-pass filter 19 and an internal N node, while resistor 217 is connected between the internal N node and the ON output of differential low-pass filter 19'. Capacitor 214 is connected between the internal P node and the internal N node. Capacitor 218 is connected between the OP and ON outputs of differential low-pass filter 19'.

Although more complex, second-order differential low-pass filter 19' can be more effective than first-order differential low-pass filter 19. Second-order differential low-pass filter 19' can replace first-order differential low-pass filter 19 in various embodiments such as FIG. 11.

Figure 13:
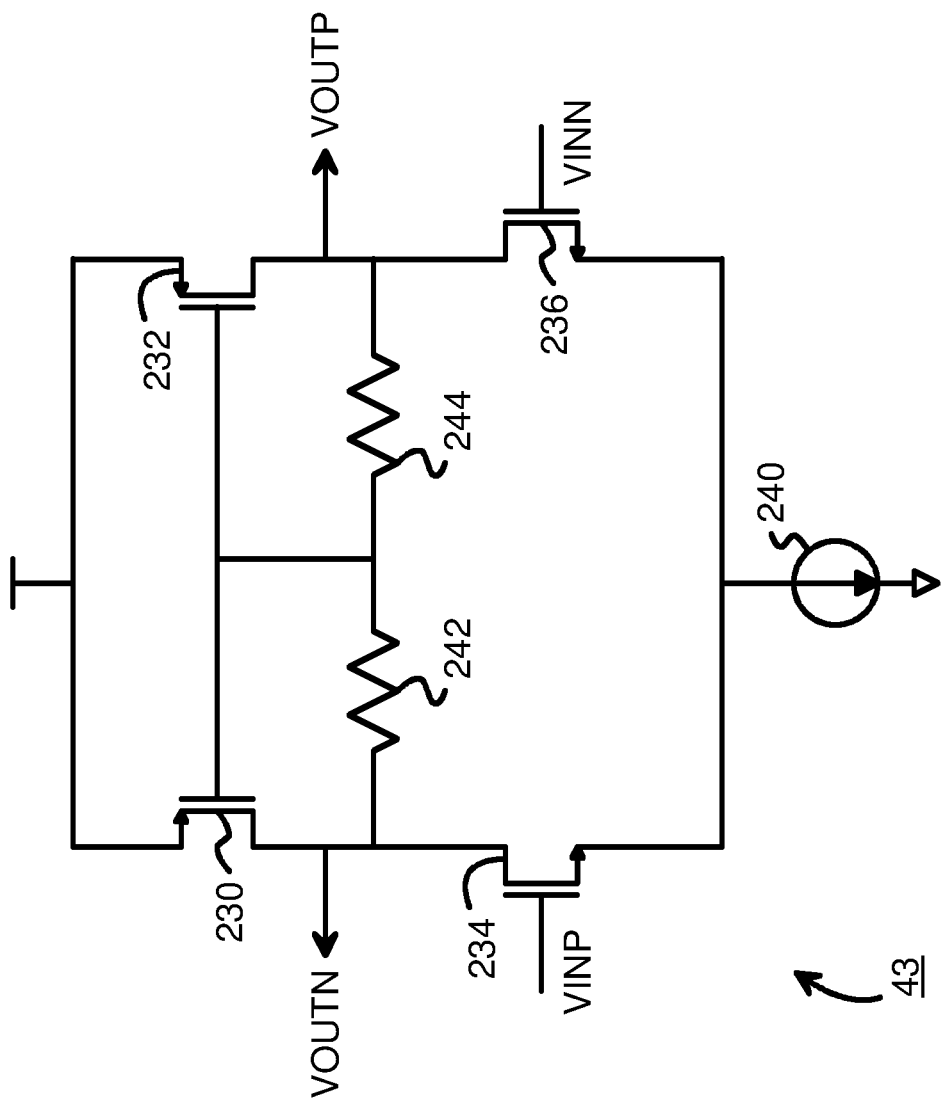
FIG. 13 shows in more detail the differential amplifier in the offset corrector.

FIG. 13 shows in more detail the differential amplifier in the offset corrector. Differential amplifier 43 has tail current source 240 that sinks current from the sources of n-channel transistors 234, 236. Current mirror p-channel transistors 230, 232 have their gates connected together as mirrored current sources. Resistors 242, 244 are in series between the drains of transistors 230, 232, withe a midpoint node between resistors 242, 244 that drives the gates of transistors 230, 232.

The drains of transistors 230, 234 connect together to drive the VOUTN output, while the drains of transistors 232, 236 connect together and drive the output VOUTP. VOUTP, VOUTN form a differential output, while VINP, VINN are the differential input.

The input VINP to differential amplifier 43 is applied to the gate of transistor 234 while the input VINN to differential amplifier 43 is applied to the gate of transistor 236. P-channel transistors 230, 232 can be long channel devices while n-channel transistors 234, 236 can be short channel, fast devices with good Gm. Resistors 242, 244 can be well-matched resistors, such as thin-film resistors.

Differential amplifier 43 can be designed as a sense amplifier $k*2/GmR_{ON}$ where k is $(C_1+C_2+C_3)/C_3$.

The gain of differential amplifier 43 is related to:

$$A_{OS}=Gm_{1a,1b}R_{1a,1b}$$

where R1a, 1b is the resistance of each of resistors 242, 244, and Gm1a, 1b is the gain of each of transistors 234, 236.

The offset can be reduced by as much as 75% using offset corrector 200 or differential offset corrector 202. As temperature gradually changes, low-pass filter 40 will adjust the offset for the new environmental conditions, allowing the ADC to track temperature changes. Similarly, aging of the circuit is compensated for by offset corrector 200 as the offset changes over time.

ALTERNATE EMBODIMENTS

Several other embodiments are contemplated by the inventor. For example level shifters may be added, such as between the core reference buffer and the multiple ADC channels. The voltage levels assigned to power and ground may be shifted, so that the common-mode or middle of the supply range is defined as ground with a positive and a negative supply terminals, where the negative supply terminal is the old ground.

Equalizing could be performed by a switch connecting the P and N lines together, or by multiple switches connecting the P and the N line to a fixed voltage, such as ground or VCM. Switch 17 between VOP, VON could also have additional switches to VCM, as one example.

Many variations of the ADC stages are possible. The analog inputs AINP, AINN to first capacitor array 32' may connect to VINP, VINN, respectively, of FIG. 1, and the outputs of switches 62, 63 may connect to VINP, VINN, respectively, of another instance of the circuit of FIG. 1 that implement second capacitor array 34'. The inputs to comparator 12 of FIG. 1 can be combining nodes VXP, VXN for first capacitor array 32' and VYP, VYN for second capacitor array 34'. This is sometimes referred to as bottom plate sampling.

Figure 1:
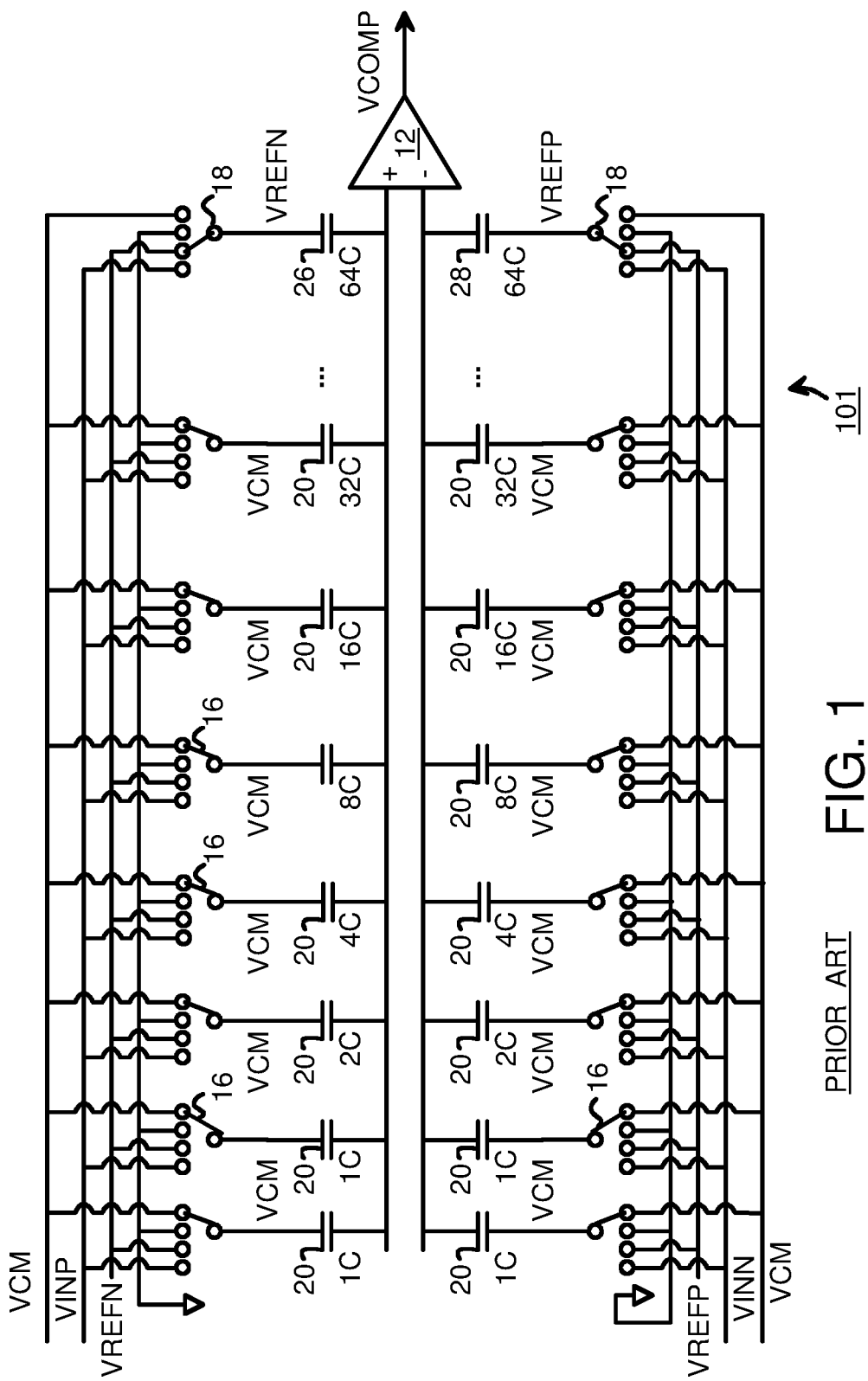
FIG. 1 shows a capacitor array in an ADC.
Figure 2:
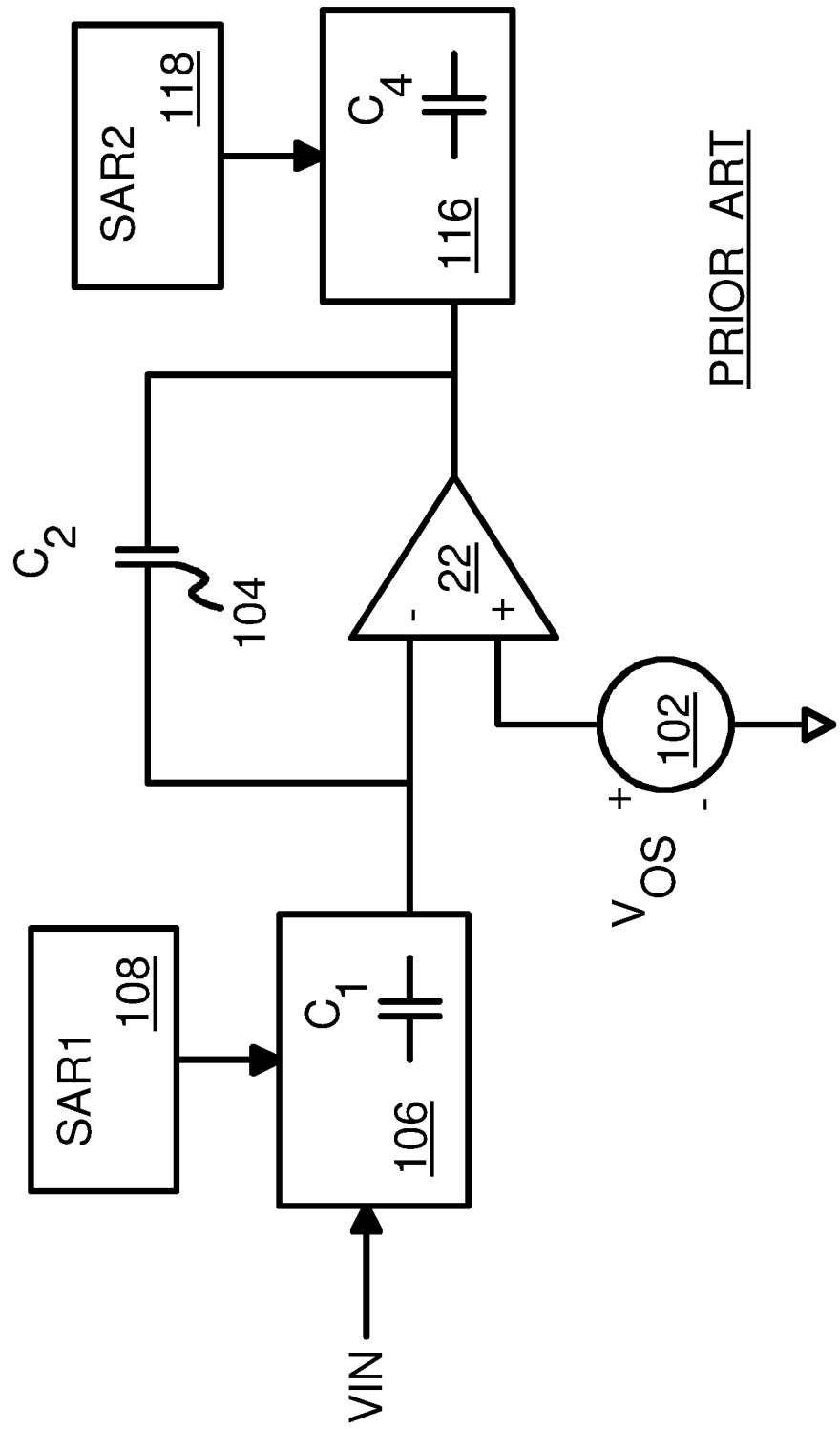
FIG. 2 shows a prior art multi-stage ADC with a residue amplifier.

Another alternative is top plate sampling, wherein the analog inputs AINP, AINN to first capacitor array 32' may connect to combining nodes VXP, VXN to comparator 12 (FIG. 1). The circuit of FIG. 1 is changed to have AINP or VINP switched to VXP to the upper input of comparator 12, and to have AINN or VINN switched to VXN to the lower input of comparator 12. Signal loss can be reduced with top plate sampling, but additional calibration may be needed. Other variations are possible.

While switched-capacitor SAR ADC stages have been shown, flash-ADC stages may be substituted for a pipeline-flash ADC. A hybrid ADC may have a flash ADC for one stage, and a SAR-ADC for the other stage. While first capacitor array 32 with a 5-bit resolution and second capacitor array 34 with an 8-bit resolution have been described, other resolutions may be substituted, such as 3-bit/5-bit, 7-bit/10-bit, etc. Various redundancy and calibration may be implemented.

While two stages with SAR1 108, first capacitor array 32, and SAR2 118, second capacitor array 34, have been shown, more stages could be added, such as by having second capacitor array 34 output its residue voltage to another residue amplifier 30, which then drives a third capacitor array that is converted by a third SAR. Offset corrector 200 could be embedded with each residue amplifier, or only in the first residue amplifier and not in subsequent residue amplifiers.

While a single-ended ADC has been shown and described for better understanding of the principles and operation, the differential ADC shown has better matching and noise rejection. While an embodiment of amplifier 42 and of differential amplifier 43 have been shown, other amplifier circuits and types of amplifiers may be substituted. Likewise, first and second order low-pass filters 40 and differential low-pass filter 19 have been shown, other filter circuits may be used. Additional components may be added. Many circuit implementations of residue amplifier 22 and differential residue amplifier 30 are also possible. Variations of offset corrector 200 and differential offset corrector 202 are also possible. Offset voltage can be reduced by 70-90% using offset correction.

Terms such as top, bottom, up, down, upper, lower, etc. are relative and are not meant to be limiting. Inversions may be added, such as by swapping + and − inputs or outputs, or by adding inverters. While a simple two-phase clocking scheme has been described, with phase P1 and phase P2, more complex clocking may be substituted, and three, four, or more phases may be used. Clock signals may be delayed to some switches. Timing skews may be added. Additional equalizing or biasing switches may be added, such as between VIN, VIP in FIG. 11. While analog voltages have been described, analog currents could also be converted and the residue could be a residue current.

While n-channel Metal-Oxide-Semiconductor Field-Effect Transistors (MOSFETs) and p-channel transistors have been described, other kinds of transistors that can be substituted, such as bipolar NPN, PNP, Fin Field-Effect Transistor (FinFET), or Junction FET (JFET).

Current sources could be approximated or implemented as transistors having gate and drains connected together, or depletion mode transistors or native transistors. Self-biasing or bandgap reference voltages may be used.

Additional components may be added at various nodes, such as resistors, capacitors, inductors, transistors, etc., and parasitic components may also be present. Enabling and disabling the circuit could be accomplished with additional transistors or in other ways. Pass-gate transistors or transmission gates could be added for isolation. Inversions may be added, or extra buffering. Capacitors may be connected together in parallel to create larger capacitors that have the same fringing or perimeter effects across several capacitor sizes. Switches could be n-channel transistors, p-channel transistors, or transmission gates with parallel n-channel and p-channel transistors, or more complex circuits, either passive or active, amplifying or non-amplifying.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. A multi-stage Analog-to-Digital Converter (ADC) with an embedded offset corrector comprising:
a first ADC stage that converts an analog input into a first M digital bits that represent an analog value of the analog input, wherein M is a whole number of at least 3, the first ADC stage outputting a residue after quantization of the analog input to the first M digital bits;
a residue amplifier having a first input that receives the residue from the first ADC stage and generates a first output;
a feedback capacitor connected between the first input and the first output of the residue amplifier;
a second ADC stage that converts the first output from the residue amplifier into a second N digital bits that represent an analog value of the first output from the residue amplifier, wherein N is a whole number of at least 5;
an offset capacitor for storing an offset;
an offset corrector that filters the first output of the residue amplifier to generate a filtered offset that is stored on the offset capacitor; and
an offset switch, connected between the offset capacitor and the first input of the residue amplifier, the offset switch applying the offset stored on the offset capacitor to the first input.

2. The multi-stage ADC with an embedded offset corrector of claim 1 wherein the offset corrector further comprises:
a low-pass filter that receives the first output from the residue amplifier, and generates a filtered offset;
an offset amplifier that receives the filtered offset and generates a buffered offset;
wherein the offset capacitor has an input terminal and an output terminal;
an offset-loading switch that connects the buffered offset to the input terminal of the offset capacitor;
wherein the offset switch is connected to the output terminal of the offset capacitor;
wherein the offset corrector further comprises:
an input grounding switch that grounds the input terminal of the offset capacitor;
an output grounding switch that grounds the output terminal of the offset capacitor.

3. The multi-stage ADC with an embedded offset corrector of claim 2 further comprising:
a first stage switch connected between a residue output of the first ADC stage and the first input, for connecting the residue to the first input of the residue amplifier;
a second stage switch connected between the first output of the residue amplifier and the second ADC stage, for connecting an amplified residue output from the residue amplifier to an analog input of the second ADC stage.

4. The multi-stage ADC with an embedded offset corrector of claim 3 further comprising:
a first phase clock that is active during an autozeroing phase of the residue amplifier;
a second phase clock that is inactive during the autozeroing phase of the residue amplifier and is active during an amplifying phase of the residue amplifier;
wherein the output grounding switch and the offset-loading switch each further comprise a first-phase clock input that receives the first phase clock and causes switch closure when the first phase clock is active and switch opening when the first phase clock is inactive;
wherein the first stage switch, the second stage switch, the input grounding switch, and the offset switch each further comprise a second-phase clock input that receives the second phase clock and causes switch closure when the second phase clock is active and switch opening when the second phase clock is inactive.

5. The multi-stage ADC with an embedded offset corrector of claim 4 wherein during the autozeroing phase:
the first input and the first output of the residue amplifier are grounded;
the output grounding switch is closed to ground the output terminal of the offset capacitor; and
the offset-loading switch is closed to connect the buffered offset to the input terminal of the offset capacitor; and
the first stage switch, the second stage switch, the input grounding switch, and the offset switch are open and block current flow;
wherein during the amplifying phase:
the first stage switch, the second stage switch, the input grounding switch, and the offset switch are closed and allow current flow;
the output grounding switch is open; and
the offset-loading switch is open to disconnect the buffered offset from the input terminal of the offset capacitor.

6. The multi-stage ADC with an embedded offset corrector of claim 4 wherein the residue amplifier is a differential amplifier and further comprises a second input and a second output, wherein the first input and the second output are inverting and the second input and the first output are non-inverting;
wherein the first ADC stage outputs the residue and a complement residue;
wherein the second ADC stage converts the first output and the second output from the residue amplifier into the second N digital bits;
further comprising:
a second feedback capacitor connected between the second input and the second output of the residue amplifier;
a complement offset capacitor for storing a complement offset;
wherein the offset corrector filters the first output and the second output of the residue amplifier to further generate a complement filtered offset that is stored on the complement offset capacitor;
wherein the offset amplifier further receives the complement filtered offset and generates a complement buffered offset;

a complement offset switch, connected between the complement offset capacitor and the second input of the residue amplifier, the complement offset switch applying the complement offset stored on the complement offset capacitor to the second input.

7. The multi-stage ADC with an embedded offset corrector of claim 6 wherein the complement offset capacitor has a complement input terminal and a complement output terminal;
a complement offset-loading switch that connects the complement buffered offset to the complement input terminal of the complement offset capacitor;
wherein the complement offset switch is connected to the complement output terminal of the complement offset capacitor.

8. The multi-stage ADC with an embedded offset corrector of claim 7 wherein the complement offset corrector further comprises:
a complement input grounding switch that grounds the complement input terminal of the complement offset capacitor;
a complement output grounding switch that grounds the complement output terminal of the complement offset capacitor.

9. The multi-stage ADC with an embedded offset corrector of claim 8 further comprising:
a complement first stage switch connected between the complement residue output of the first ADC stage and the second input, for connecting the complement residue to the second input of the residue amplifier;
a complement second stage switch connected between the second output of the residue amplifier and the second ADC stage, for connecting an amplified complement residue output from the residue amplifier to a complement analog input of the second ADC stage;
an equalizing switch, connected between the first output and the second output of the residue amplifier, for connecting the first output to the second output during the autozeroing phase.

10. An offset-correcting multi-stage Analog-to-Digital Converter (ADC) comprising:
a first Analog-to-Digital Converter (ADC) stage having an analog input and switched capacitors for quantizing the analog input to generate M Most-Significant Bits (MSBs) that represent the analog input, and generating a residue of quantization on a first ADC P output and a first ADC N output;
wherein M is a whole number of at least 3;
a Residue Amplifier (RA) having an inverting input and a non-inverting input, and generating a RA P output and a RA N output;
a first feedback capacitor connected between the inverting input and the RA P output;
a second feedback capacitor connected between the non-inverting input and the RA N output;
a first stage P switch that connects the first ADC P output to the inverting input during an amplifying phase;
a first stage N switch that connects the first ADC N output to the non-inverting input during the amplifying phase;
a second ADC stage, having a second P input and a second N input, for converting an analog difference between the second P input and the second N input into a second N digital bits, wherein N is a whole number of at least 5;
a second stage P switch that connects the RA P output to the second P input during the amplifying phase;
a second stage N switch that connects the RA N output to the second N input during the amplifying phase; and
an offset corrector that receives the RA P output and the RA N output, and filters the RA P output and the RA N output to generate a P filtered error and an N filtered error;
wherein the P filtered error is stored and applied to the inverting input of the residue amplifier, and the N filtered error is stored and applied to the non-inverting input of the residue amplifier to correct offset error.

11. The offset-correcting multi-stage ADC of claim 10 wherein the offset corrector further comprises:
a P offset capacitor having a P first terminal and a P second terminal;
a P offset switch that connects the P second terminal to the inverting input of the residue amplifier during the amplifying phase;
a P offset-storing switch that connects the P filtered error to the P first terminal during an autozeroing phase;
an N offset capacitor having a N first terminal and an N second terminal;
an N offset switch that connects the N second terminal to the non-inverting input of the residue amplifier during the amplifying phase;
an N offset-storing switch that connects the N filtered error to the N first terminal during the autozeroing phase.

12. The offset-correcting multi-stage ADC of claim 11 further comprising:
a first P grounding switch that grounds the P first terminal during the amplifying phase;
a second P grounding switch that grounds the P second terminal during the autozeroing phase;
a first N grounding switch that grounds the N first terminal during the amplifying phase; and
a second N grounding switch that grounds the N second terminal during the autozeroing phase.

13. The offset-correcting multi-stage ADC of claim 11 wherein the offset corrector further comprises:
a low-pass filter that receives the RA P output and the RA N output, and filters the RA P output and the RA N output to generate a P filtered node and an N filtered node;
an amplifier that receives the P filtered node and the N filtered node and drives a P error to the P first terminal for storage on the P offset capacitor, and drives an N error to the N first terminal for storage on the N offset capacitor.

14. The offset-correcting multi-stage ADC of claim 13 wherein the low-pass filter has a time constant of at least 100 cycles of the autozeroing phase and the amplifying phase, wherein the low-pass filter has a long time constant.

15. The offset-correcting multi-stage ADC of claim 14 wherein the low-pass filter is a second-order filter.

16. The offset-correcting multi-stage ADC of claim 13 further comprising:
an equalizing switch that connects the RA P output to the RA N output during the autozeroing phase.

17. The offset-correcting multi-stage ADC of claim 13 wherein the first ADC stage further comprises a first Successive-Approximation-Register (SAR) and a first capacitor array of weighted capacitors and switches that are controlled by bits in the first SAR, wherein a Successive-Approximation routine is executed during the autozeroing phase of the residue amplifier to adjust bits in the first SAR to quantize the analog input;

wherein the second ADC stage further comprises a second SAR and a second capacitor array of weighted capacitors and switches that are controlled by bits in the second SAR, wherein a Successive-Approximation routine is executed during the autozeroing phase of the residue amplifier to adjust bits in the second SAR during quantization.

18. A multi-stage Analog-to-Digital Converter (ADC) comprising:
a first Analog-to-Digital Converter (ADC) stage having an analog input and switched capacitors for quantizing the analog input to generate M Most-Significant Bits (MSBs) that represent the analog input, and generating a residue of quantization on a first ADC P output and a first ADC N output;
wherein M is a whole number of at least 3;
a Residue Amplifier (RA) having an inverting input and a non-inverting input, and generating a RA P output and a RA N output;
a first stage P switch that connects the first ADC P output to the inverting input during an amplifying phase;
a first stage N switch that connects the first ADC N output to the non-inverting input during the amplifying phase;
a second ADC stage, having a second P input and a second N input, for converting an analog difference between the second P input and the second N input into a second N digital bits, wherein N is a whole number of at least 5;
a second stage P switch that connects the RA P output to the second P input during the amplifying phase;
a second stage N switch that connects the RA N output to the second N input during the amplifying phase;
a low-pass filter that receives the RA P output and the RA N output, and filters the RA P output and the RA N output to generate a P filtered node and an N filtered node;
an amplifier that receives the P filtered node and the N filtered node and drives a P error node and an N error node;
a P offset capacitor having a P first terminal and a P second terminal;
a P offset-storing switch that connects the P error node to the first P terminal during an autozeroing phase;
a P offset switch that connects the P second terminal to the inverting input of the residue amplifier during the amplifying phase;
an N offset capacitor having a N first terminal and an N second terminal;
an N offset-storing switch that connects the N error node to the N first terminal during the autozeroing phase;
an N offset switch that connects the N second terminal to the non-inverting input of the residue amplifier during the amplifying phase; and
an equalizing switch that connects the RA P output to the RA N output during the autozeroing phase.

19. The multi-stage ADC of claim 18 further comprising:
a first feedback capacitor connected between the inverting input and the RA P output;
a second feedback capacitor connected between the non-inverting input and the RA N output;
a first P grounding switch that grounds the P first terminal during the amplifying phase;
a second P grounding switch that grounds the P second terminal during the autozeroing phase;
a first N grounding switch that grounds the N first terminal during the amplifying phase; and
a second N grounding switch that grounds the N second terminal during the autozeroing phase.

20. The multi-stage ADC of claim 18 further comprising:
a first feedback capacitor connected between a first analog residue output of the second ADC stage and the inverting input;
a second feedback capacitor connected between a second analog residue output of the second ADC stage and the non-inverting input,
whereby the multi-stage ADC is loading-free.

* * * * *